United States Patent [19]

Sinha

[11] 4,419,600

[45] Dec. 6, 1983

[54] STRESS-COMPENSATED QUARTZ RESONATORS

[75] Inventor: Bikash K. Sinha, West Redding, Conn.

[73] Assignee: Schlumberger Technology Corporation, New York, N.Y.

[21] Appl. No.: 267,507

[22] Filed: May 27, 1981

Related U.S. Application Data

[63] Continuation-in-part of Ser. No. 204,400, Nov. 5, 1980, abandoned.

[51] Int. Cl.$^3$ ............................................. H01L 41/08
[52] U.S. Cl. .................................. 310/361; 310/338; 310/360
[58] Field of Search ...................... 310/360, 361, 338

[56] References Cited

U.S. PATENT DOCUMENTS

| | | | |
|---|---|---|---|
| 2,277,245 | 3/1942 | Mason | 310/361 |
| 2,743,144 | 4/1956 | Bottom et al. | 310/361 |
| 3,423,609 | 1/1969 | Hammond | 310/361 |
| 3,561,832 | 2/1971 | Karrer et al. | 310/361 |
| 3,577,781 | 5/1971 | Lebourg et al. | 310/361 |
| 3,826,931 | 7/1974 | Hammond | 310/361 |
| 4,079,280 | 3/1978 | Kusters et al. | 310/361 |
| 4,160,183 | 7/1979 | Kusters et al. | 310/361 |

OTHER PUBLICATIONS

"Higher-Order Temperature Coefficients of the Elastic Stiffness and Compliances of Alpha-Quartz" by Bechmann et al., Proceedings of IRE, vol. 50, No. 8, Aug. 1962, pp. 1812–1822.
"Calculations of the Stress Compensated (SC-Cut) Quartz Resonator" by EerNisse, Proceedings on the 30th Annual Symposium on Frequency Control, Jun. 1976, pp. 8–11.
"Transient Thermal Compensation for Quartz Resonators," by Ballato, *Proceedings of the 31st Annual Symposium on Frequency Control*, 1977, pp. 8–16.
"Dual Mode Operation of Temperature and Stress Compensated Crystals" by Kusters et al., Proceedings of the 32nd Annual Symposium on Frequency Control, 1978, pp. 389–397.
"Design Aspects of an Oscillator Using the SC-Cut Crystal" by Burgoon et al., Proceedings of the 33rd Annual Symposium on Frequency Control, May 1979, pp. 411–416.

*Primary Examiner*—Mark O. Budd
*Attorney, Agent, or Firm*—David H. Carroll

[57] ABSTRACT

A stress compensated thickness-shear resonator is of an orientation (yxwl) $\phi/\theta$ selected from loci of stress compensated orientations provided for both the fast and slow thickness-shear modes of vibration. A stress compensated orientation is used in an oscillator for stable frequency-stress behavior. A stress compensated orientation having large-valued temperature coefficients of frequency is used in a temperature sensor for precision measurements. A stress and temperature compensated orientation is used in a pressure sensor such that the temperature compensated thickness-shear mode is used for pressure measurement while the stress compensated thickness-shear mode is used to compensate for effects of temperature.

23 Claims, 13 Drawing Figures

STRESS-COMPENSATED QUARTZ RESONATORS

BACKGROUND OF THE INVENTION

This application is a continuation-in-part of an earlier copending application of the same inventor, U.S. Application Ser. No. 204,400, filed Nov. 5, 1980, now abandoned.

This invention relates to thickness-shear quartz resonators, and more particularly to thickness-shear quartz resonators having crystallographic axes oriented such that the resonators are stress compensated and particularly useful in such applications as frequency control, temperature measurements and pressure measurements.

Interest in the temperature compensated characteristics of various orientations of quartz for vibration in the thickness-shear mode, dating as far back as 1950 and earlier, led to the development of loci of temperature compensated orientations for both B and C thickness-shear modes of vibration. The frequency-temperature behavior of a quartz resonator can be represented by a power series expansion. The contribution of the fourth and higher order terms is typically less than one part in $10^8$ over a temperature range of two hundred degrees Celcius or more, so that these terms generally can be ignored. The shape of the curve can be expressed algebraically by the lower order terms as:

$$\Delta f/f_o + A(\Delta T) + B(\Delta T)^2/2! + C(\Delta T)^3/3! \quad (1)$$

where $f_o$ is the resonant frequency at a selected reference temperature; A, B and C are first, second and third order temperature coefficients of frequency respectively; and $\Delta T$ is the resonator temperature minus a selected reference temperature. Where frequency-temperature stability ($\Delta f/f_o = 0$) is desired in a nonzero $\Delta T$ environment without external temperature compensation, at least the lowest order temperature coefficient A must be zero or practically zero. Quartz cuts having temperature coefficients of such value are referred to as "temperature compensated."

Temperature compensated orientations have been exhaustively studied (see, for example, Bechmann, R., et al., Higher-Order Temperature Coefficients of the Elastic Stiffnesses and Compliances of Alpha-Quartz, Proceedings of the IRE, Vol. 50, No. 8, August 1962, pp. 1812–22) and the results for both thickness-shear modes of vibration, the "B" and "C" modes are presented in FIGS. 1 and 2 (Prior Art). In both figures, $\phi$ is plotted on the abscissa and $\theta$ is plotted on the ordinate. FIG. 1 illustrates the zero temperature coefficients loci for B mode of vibration (temperature coefficient A for B mode equal to zero), which are indicated at loci 2, 4 and 6. FIG. 2 illustrates the zero temperature coefficients loci for C mode of vibration (temperature coefficient A for C mode equal to zero), which are indicated at loci 8 and 10. Of the "singly rotated" cuts, $\theta$, the best known are the BT cut ((yxwl) 0°/−49.22°), indicated in FIG. 1 at 12, and the AT cut ((yxwl) 0°/35.25°), indicated in FIG. 2 at 14. Some known temperature compensated "doubly rotated" cuts (yxwl) $\phi/\theta$ are the IT cut (yxwl) 20°/34.33° (Bottom and Ives, 1951) indicated at 18 in FIG. 2, the RT cut (yxwl) 15°/−34.5° (Bechmann, 1961) indicated at 20 in FIG. 2, and the FC cut (yxwl) 15°/34.33° (Lagasse et al., 1972) indicated at 16 in FIG. 2. See, for example, U.S. Pat. No. 2,277,245, issued Mar. 24, 1942 to Mason; U.S. Pat. No. 2,743,144, issued Apr. 24, 1956 to Bottom et al.; U.S. Pat. No. 3,423,609, issued Jan. 21, 1969 to Hammond.

The AT and BT cuts are extremely well known in the art, having been widely used in the control of high-frequency oscillators and widely studied. Holland studied the relations that express the tensions, strains and displacements of an arbitrarily anisotropic elastic plate under nonuniform heating. See Holland, R., Nonuniformly Heated Anisotropic Plates: I. Mechanical Distortion and Relaxation, IEEE Transactions on Sonics and Ultrasonics, Vol. SU-21, No. 3, July 1974, pp 171–78; Holland, R., Nonuniformly Heated and Isotropic Plates: II. Frequency Transients in AT and BT Quartz Plates, 1974 IEEE Ultrasonics Symposium Preceedings, IEEE Cat. 74 CHO 896-1SU, November 1974, pp. 592–98. It had been known that the uniform heating of a quartz plate alters its frequency due to changes in the frequency-determining dimension, in density, and in the elastic modulus. The temperature compensated quartz cuts, including the AT and BT cuts, have orientations for which these three factors nullify each other. However, Holland reported that nonuniform heating produces nonuniform internal stresses and density variations within a plate which alters its frequency due to third-order elastic effects and coupling of otherwise decoupled modes. Holland considered all five factors simultaneously to compute the frequency transients of AT and BT resonators when thermally shocked, and also predicted a doubly rotated cut that was expected to be thermal-shock compensated as well as temperature compensated in the ordinary sense. Holland called it the TS cut ((yxwl) 22.8°/34.3°).

About the same time, EerNisse reported an orientation for the slow thickness-shear mode of vibration, the SC cut ((yxwl) 22.5°/34.3°, which has approximately the same orientation as the TS cut and also lies on the previously known first order temperature locus. EerNisse studied electrode induced frequency shifts in quartz resonators at a given temperature. See EerNisse, E. P., Quartz Resonator Frequency Shifts Arising from Electrode Stress, Proceedings of the 29th Annual Symposium on Frequency Control, May 1975, pp. 1–4; EerNisse, E. P., Calculations on the Stress Compensated (SC-Cut) Quartz Resonator, Proceedings of the 30th Annual Symposium on Frequency Control, June 1976, pp. 8–11. While Holland was concerned with the dependence of resonant frequency on transient thermally-induced stresses in the resonator, EerNisse addressed the effect of mechanical stresses on the resonant frequency.

The theoretical predictions by Holland (1974) and EerNissee (1975) were followed by experimental confirmation. See, for example, Kusters, J. A., Transient Thermal Compensation for Quartz Resonators, IEEE Transactions on Sonics and Ultrasonics, Vol. SU-23, No. 4, July 1976; Ballato, A. et al., The Force-Frequency Effect in Doubly Rotated Quartz Resonators, Proceedings of the 31st Annual Symposium on Frequency Control, 1977, pp. 8–16. Because of its stress compensated characteristics, the SC cut (also variously known as the TS cut and the TTC cut (yxwl) 21.93°/33.93°, U.S. Pat. No. 4,160,183, issued July 3, 1979 to Kusters et al.) has become favored for frequency control applications and applications requiring frequency stability. The SC orientation is indicated at 22 in FIG. 2.

In addition, it has been proposed that a small region ($22° < \phi < 23°$; $32° < \theta < 36°$) about the SC cut orientation would also exhibit similar stress compensated characteristics. See EerNisse, E. P., Calculations on the Stress Compensated (SC-cut) Quartz Resonators, Proceedings of the 30th Annual Symposium on Frequency Control, 1976, pp. 8–11. It is believed that the SC cut and its neighboring region, despite the general advantages of stress compensated orientations, is the only stress compensated cut known in the art.

A thickness-shear resonator is useful in that it can be excited into resonance through the application of an external electric field, which is preferably applied to the resonator through electrodes formed thereon by means of vacuum deposition of conductive metals such as copper, or preferably gold. The resonant frequency (or frequencies if the resonator is excited in both thickness-shear modes of vibration) is dependent on the elastic coefficients, density, thickness, and overtone operation of the resonator. The resonant frequency shifts in relation to changes in temperature, pressure or externally applied force (for example, the stress caused by the electrodes at their boundaries with the resonator). The capability of a quartz resonator to experience a shift in its resonant frequency is quite useful in sensor applications (but not in frequency control) if the resonator is responding essentially to only one of the variables of temperature, pressure, voltage, or externally applied force within a relatively narrow operating range. If the resonator is responsive to more than one variable in its intended operating range, then it is necessary to be able to compensate for the variable(s) other than the one being measured in order to successfully measure the desired variable.

Conventional methods for making the frequency of a resonator minimally dependent on temperature variations included three approaches. The first approach utilizes a heated oven to control the frequency of the resonator. To further improve the frequency-temperature performance, the resonator typically is cut in one of the temperature compensated orientations for which it has inherently good frequency stability over a narrow temperature range. Two widely used singly rotated orientations are the AT and BT, discussed above. While oscillators based on this approach can have excellent frequency stability, several disadvantages have become apparent. The oven has become the predominant power user. Moreover, a thermal stabilization time of many minutes is required when the oven is first turned on. A large portion of this time is necessary to allow thermal gradients in the resonator to equilibriate and thus the advantage of instant warm-up of transistors circuits is lost. Furthermore, optimum temperature control of the resonator is not possible unless its actual temperature is known. Because the thermal sensing element can not be placed in intimate contact with the resonator, a sensing discrepancy is likely which degrades frequency stability.

VCXO's (Voltage Controlled Crystal Oscillators) and TCXO's (Temperature Controlled Crystal Oscillators) represent the second approach. The VCXO typically includes a combination of a crystal resonator, an amplifier, and a voltage variable phase shifter. The voltage which is applied to the variable phase shifter represents a feedback signal derived from some form of temperature sensor, usually a thermistor or thermistor bridge, although more elaborate methods are possible. The TCXO includes in the crystal resonator feedback path carefully selected reactive components which are not voltage variable, but which have a temperature-characteristic response which compensates for the temperature behavior of the crystal resonator.

The third approach also utilizes characteristics of crystal resonators to obtain temperature compensation without the use of an oven. U.S. Pat. No. 3,826,931, issued July 30, 1974 to Hammond, describes a resonator apparatus that utilizes either a single quartz crystal vibrating in two selected modes or two quartz crystals each vibrating in a single selected mode to form a resonator output frequency that is the sum or difference of the two crystal frequencies.

These approaches experience a significant common drawback. The temperature compensation described is static compensation, i.e., temperature compensation is achieved only under conditions where the ambient temperature is slowly changing. Rapidly changing temperatures sufficient to cause thermal gradients through the crystal resonator, cause instantaneous frequency shifts orders of magnitude greater than the static stability of the device. For example, the AT cut resonator in an oven can have short term stabilities which are several parts in $10^{10}$. However, a 1° C. temperature gradient through the crystal resonator can cause a sudden frequency shift of 36 parts in $10^6$.

The disadvantages of these approaches purportedly are overcome by the use of the SC cut, which appears to exhibit the necessary frequency-temperature stability over narrow temperature ranges to obtain good static compensation with either the first or second approach. In addition, the SC-cut is claimed to be frequency independent of internal stresses in the resonator caused by deposited electrode patterns, resonator mounts, and external applied stress in the major plane of the resonator. The SC cut is superior for certain applications to the AT and BT cuts in its frequency-temperature and frequency-stress behavior.

For application of the SC cut in fast warm-up oscillators, Kusters reported that another strongly piezoelectric mode, the fast thickness-shear or B mode, is located very near in frequency to the temperature compensated C mode. Although near frequencies normally are disadvantageous because of the difficulty in distinguishing between them, Kusters proposed that the B mode could be used as an instantaneous indication of resonator temperature to compensate for frequency drift, thereby eliminating thermal lag effects and other disadvantages associated with thermisters, thermocouples, and other temperature sensing devices. See Kusters et al., "Dual Mode Operation of Temperature and Stress Compensated Crystals," Proceedings, Thirty-Second Annual Symposium on Frequency Control 1978, pp. 389–97; U.S. Pat. No. 4,079,280, issued Mar. 14, 1978 to Kusters et al.; the Kusters '183 patent.

In temperature measurement applications, orientations have been proposed which, for example, permit the measurement of temperature as a linear function of resonant frequency. See, for example, the Hammond '609 patent. It has been necessary, however, to use a highly compliant (stress-attenuating) resonator mounting and enclosure. A quartz thermometer employing such means is commercially available from the Hewlett-Packard Company, Palo Alto, California, under model number 2804A (Electronic Instruments and Systems Catalog, 1981, p. 673). The Hewlett-Packard quartz thermometer is believed to be based on a LC cut resonator having the orientation (yxwl) 11.17°/9.39° (disclosed in the Hammond '609 patent; indicated at 24 in FIG. 2) which is characterized by A≅39.8 ppm/°C. and D significantly nonzero. The LC cut resonator is ribbon-mounted in a stainless steel enclosure filled with a mixture of inert gases to minimize stress effects. See Hammond, D. & Benjaminson, A., The Linear Quartz Thermometer—A New Tool for Measuring Absolute and Difference Temperature, Hewlett-Packard Journal, Vol. 16, No. 7, March 1965, pp. 1–7. Since these inert gases generally have a lower thermal conductivity than quartz, the response time of the Hewlett-Packard quartz thermometer accordingly is adversly affected.

In pressure measurement applications, a resonator having a temperature compensated orientation with a significant nonzero value of the stress coefficient D may advantageously be used in a pressure sensor structure such as that disclosed, for example, in FIG. 1 and pertinent textual portions of U.S. Pat. No. 3,561,832, issued Feb. 9, 1971 to Karrer et al., without need for elaborate temperature compensation techniques over a small temperature range. Unfortunately, in applications requiring precise measurement of pressure, the effect of any nonzero second and higher order temperature coefficients of this and the other orientations defined by either the B or C mode temperature compensated orientation loci introduces significant error into the pressure measurement. For this reason, high precision quartz pressure sensors with fast response time, large dynamic range, and precise operation over an extended temperation range are not available.

Despite progression from the AT, BT, IT, FC and RT cuts to the development of the SC cut which found use in high precision frequency control applications, and recognition of the advantages of stress compensated orientations in such applications, other stress-compensated orientations are not known in the art. Presently known temperature sensors must be elaborately shielded from external force effects. Presently known pressure sensors are not satisfactory for high precision measurements requiring fast response time, large dynamic range, and precise operation over an extended temperature range.

SUMMARY OF THE INVENTION

An object of the invention therefore is to provide novel stress compensated orientations of quartz.

Another object of the invention is to provide quartz resonator devices having desirable stress compensated properties which are suitable for frequency control applications.

Another object of the invention is to provide quartz resonator devices having desirable stress compensated properties which are suitable for temperature measurement applications.

Another object of the invention is to provide quartz resonator devices having stress and temperature compensated properties rendering them comparable or superior to known orientations, notably the SC orientation, for certain frequency control applications.

Another object of the invention is to provide quartz resonator devices having a desirable stress compensated properties in one mode of vibration and desirable temperature-compensated properties in another mode of vibration suitable for high precision pressure measurement applications over a wide temperature range.

Another object of the invention is to provide novel stress compensated orientations of quartz for overcoming the disadvantages set forth above.

The aforementioned objects are achieved in accordance with the present invention by a stress compensated thickness-shear resonator adapted to vibrate in at least one of its fast and slow thickness-shear modes of vibration at a frequency substantially determined by the thickness thereof. The resonator is of an orientation selected from the group consisting of the orientations (yxwl) $\phi/\theta$ defined by the loci of FIG. 10 and the orientations (yxwl) $\phi/\theta$ defined by the loci of FIG. 11, plus or minus 4° in $\phi$ and $\theta$.

Furthermore, the aforementioned objects are achieved in accordance with the present invention by an oscillator having stable frequency-stress behavior. The oscillator comprises a stress compensated thickness-shear resonator adapted to vibrate in at least one of its fast and slow thickness-shear modes of vibration at a frequency substantially determined by the thickness thereof, the resonator also being of an orientation selected from the group consisting of the orientations (yxwl) $\phi/\theta$ defined by the loci of FIG. 10 and the orientations (yxwl) $\phi/\theta$ defined by the loci of FIG. 11, plus or minus 4° in $\phi$ and $\theta$. The oscillator further comprises means for mounting the resonator and for transforming stresses arising from external pressure to uniform stresses in the major plane of said resonator, and means for generating and supplying an electric field to the resonator for exciting at least one thickness-shear mode.

Furthermore, the aforementioned objects are achieved in accordance with the present invention by an oscillator for temperature measurements having stable frequency-stress behavior. The oscillator comprises a stress compensated thickness-shear resonator adapted to vibrate in at least one of its fast and slow thickness-shear modes of vibration at a frequency substantially determined by the thickness thereof, the resonator also being of an orientation selected from the group consisting of the orientations (yxwl) $\phi/\theta$ defined by the loci of FIG. 10 and the orientations (yxwl) $\phi/\theta$ defined by the loci of FIG. 11, plus or minus 4° in $\phi$ and $\theta$, and having large-valued temperature coefficients of frequency A, B and/or C. The oscillator also comprises means for effecting thermal contact between said resonator and an external temperature; means for mounting the resonator and for transforming stresses arising from external pressure to uniform stresses in the major plane of the resonator; and means for generating and supplying an electric field to the resonator for exciting at least one thickness-shear mode.

Furthermore, the aforementioned objects are achieved in accordance with the present invention by a pressure sensor. The pressure sensor comprises a stress-compensated thickness-shear resonator adapted to vibrate in fast thickness-shear and slow thickness-shear modes of vibration at respective frequencies substantially determined by the thickness thereof, the resonator being approximately of the orientation (yxwl) 16.3°/−34.5° and having opposite surfaces of selected contour spaced about a substantially circular major plane, and further being stress compensated for said fast thickness-shear mode and temperature compensated for said slow thickness mode. The pressure sensor also comprises means for mounting the resonator and for transforming stresses arising from external pressure to uniform stresses in the major plane of the resonator; and means for generating and supplying an electric field to the resonator for exciting the fast and slow thickness-shear modes.

Other objects, features, and characteristics of the invention will become apparent upon consideration of the following Detailed Description and the appended Claims, with reference to the accompanying Drawings, all of which are part of this Specification.

BRIEF DESCRIPTION OF THE DRAWINGS

In the drawings, where like reference characters indicate like parts.

DETAILED DESCRIPTION OF THE PREFERRED EMBODIMENTS

As used herein, "quartz" refers to crystalline material belonging to the trigonal crystal system, international point group 32, class $D_3$ (Schoenflies symbol). The orientation of a given quartz cut is specified in accordance with standards adopted by the Institute of Radio Engineers (now the Institute of Electrical and Electronic Engineers, or "IEEE"). See "Standards on Piezoelectric Crystals—Standard 49 IRE 14.S1," Proceedings of the I.R.E. 1949, Institute of Radio Engineers, December 1949, pp. 1378-90. Both singly rotated and doubly rotated cuts will be referred to herein by the nomenclature (yxwl)$\phi/\theta$, as is well known in the art.

In the presentation that follows, the orientations of quartz cuts will be provided only for a "primitive region" of $\phi$ and $\theta$, although it will be understood that all equivalent orientations within the full 360 degrees of rotation of $\phi$ and $\theta$ are thereby defined. Quartz is a material exhibiting trigonal and digonal symmetry about the Z and X axes, respectively, meaning that orientations having $\phi = n(120°) \pm \phi_o$ (for n=0,1,2) and $\theta = \theta_o + m(180°)$ (where m=0,1) are exactly equivalent because of the crystalline symmetry. Therefore, orientations within a region defined by $0° < \phi < 60°$ and $-90° < \theta < 90°$ comprehensive define all orientations within the full 360 degrees of rotation of $\phi$ and $\theta$. This much is well known in the art.

In addition to trigonal symmetry, however, the stress compensated orientations have been found to exhibit a type of symmetry that can be represented by the relationships:

$$\phi = 60° - n(120°) \pm \phi_o \text{ where } n = 0,1,2 \qquad (2)$$

$$\theta = -\theta_o \qquad (3)$$

The various symmetries of stress compensated quartz therefore permits definition of a primitive region defined by $0° < \phi < 30°$ and $-90° < \theta < +90°$. Each orientation in the primitive region will be equivalent to eleven other orientations in their respective thickness mode characteristics. It will be understood, therefore, that all orientations or loci which can be derived from a particular orientation or loci in the primitive region by application of these symmetrical relationships are to be considered equivalent to the particular orientation insofar as their stress compensated behavior is concerned.

Figure 3:
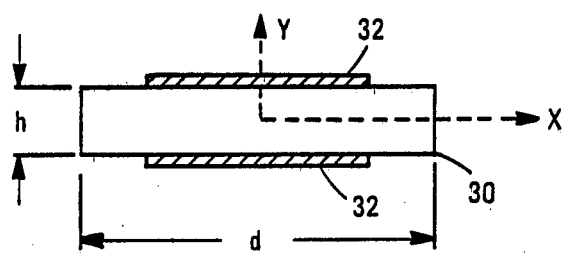
FIGS. 3 and 4 are side and top schematic views, respectively, of an exemplary resonator for the orientations of the present invention.

As used herein, "resonator" refers to a cut of quartz material that is suitably shaped, contoured and polished such as to be capable of operation in the thickness-shear mode of vibration. FIG. 3 illustrates a cross-section of a resonator 30, which preferably is a disk or a disk-like vibratory region of a rectangular plate suitably shaped and contoured and having diameter "d" and thickness "h," for which X and Y are two of the three axes parallel and normal to the major plane of the resonator, respectively. Axes X and Y define orientation angles relative to the principal axes. For some purposes, after the cutting is performed, both of the opposite surfaces of the resonator are contoured so as to produce a quartz crystal adapted for use as a bi-convex resonator. For other purposes, it is sometimes desirable after the cutting is performed, to contour one of these opposite surfaces to produce a quartz crystal that is adapted for use as a plano-convex resonator. The contouring of the surfaces is desirable for the operation of the resonator in the trapped energy mode of vibration whereby the Q-factor of the resonator is increased.

Electrodes 32 are provided for exciting the quartz material, and may comprise, for example, a thin metallic film vapor deposited on select areas of resonator 30. For some purposes, it is desirable to use the quartz resonators of this invention in the so-called "electrodeless" manner. In that manner, an A.C. electric field of high voltage is applied to the opposite surfaces of the crystal across an air gap of a few microns, as is known in the art.

Figure 4:
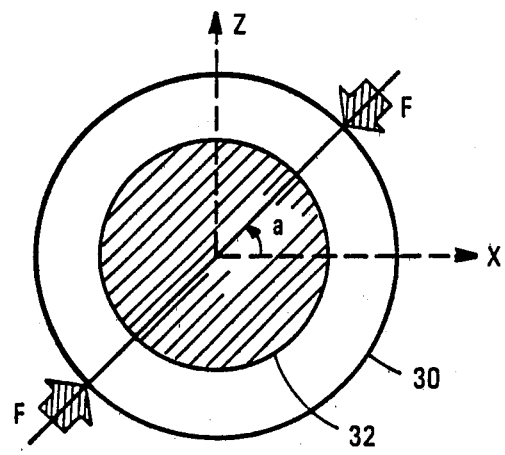

FIG. 4 illustrates a top view of resonator 30. The third or Z axis of orientation of the vibratory plate is shown, as well as the arrows "F" representing opposite force vectors which when integrated 180° about the resonator result in radially uniform planar stresses acting on the resonator. The angle "a" is defined by the direction of discrete force vectors and the X-axis. These stresses arise from such means as electrodes, externally applied load, mechanical mounts, and acceleration.

A thickness mode quartz resonator vibrates in three modes of motion, the thickness-extensional or "A" mode, the fast thickness-shear or "B" mode, and the slow thickness-shear or "C" mode, such that resonant frequencies follow the relation $f_A > f_B \geq f_C$. The displacement directions of the modes are mutually perpendicular in all materials, although the displacement directions relative to the resonator surface may differ as a function of the material. In isotropic or cubic material, two of the three displacement directions are shear and the third is thickness extension, and the directional displacements are either in the plane of the resonator or perpendicular to it. In anisotropic materials, the three displacement directions generally are neither parallel to nor exactly perpendicular to a normal to the surface, although they are orthogonal. Quartz is an anisotropic material, and therefore it will be understood that the references herein to the shear modes B and C pertains not to a precise shear mode of motion relative to the resonator surface but rather to modes of motion which are predominantly shear. The axes of these modal displacements are indicated in FIGS. 3 and 4 as X, Y and Z.

The natural resonant frequencies of a quartz resonator are affected by static mechanical stress bias, which can be caused by electrode stresses, externally applied load or mechanical mounts, and acceleration, in addition to uniform and nonuniform heating of the resonator. For purposes of the invention, the mechanical stress bias is made to act on the resonator parallel to its major plane such that all stresses are radially uniform and planar within the resonator. For this purpose, the resonator is preferably a disk or a disk-like vibratory region. In this case, both the frequency-temperature and frequency-stress behavior of a quartz resonator can be represented by generalizing equation (1) as:

$$\Delta f/f_o = A(\Delta T) + B(\Delta T)^2/2! + C(\Delta T)^3/3! + \ldots + D(\Delta P) + \ldots \quad (4)$$

where, as above, higher order terms can be ignored, and where "D" is the stress coefficient of frequency and $\Delta P$ is the resonator stress minus a selected reference stress. Where frequency-stress stability is desired in a non-zero $\Delta P$ environment without external stress compensation, the stress coefficient D must be made zero or practically zero. Quartz cuts having a stress coefficient of such value may be referred to as "stress compensated". Where frequency-temperature and frequency-stress stability ($\Delta f/f_o = 0$) is desired in a non-zero $\Delta T$ and $\Delta P$ environment without external compensation, the coefficients A and D must be made zero or practically zero.

In an investigation of the stress-frequency behavior of resonator 30, the stress coefficient D of equation (2) is considered to be the mean stress coefficient $<K_f>$, which is given by:

$$<K_f> = 1/\pi \int_0^\pi K_f(a) da \quad (5)$$

where:

$$K_f = [\Delta f/f][dh/FN] \quad (6)$$

and in which d and h are as defined above, F is the planar force in Newtons, N (which equals hf) is the frequency constant in meters/sec, and $\Delta f/f$ is the resulting fractional change in the resonant frequency for a given mode of vibration.

Figure 9:
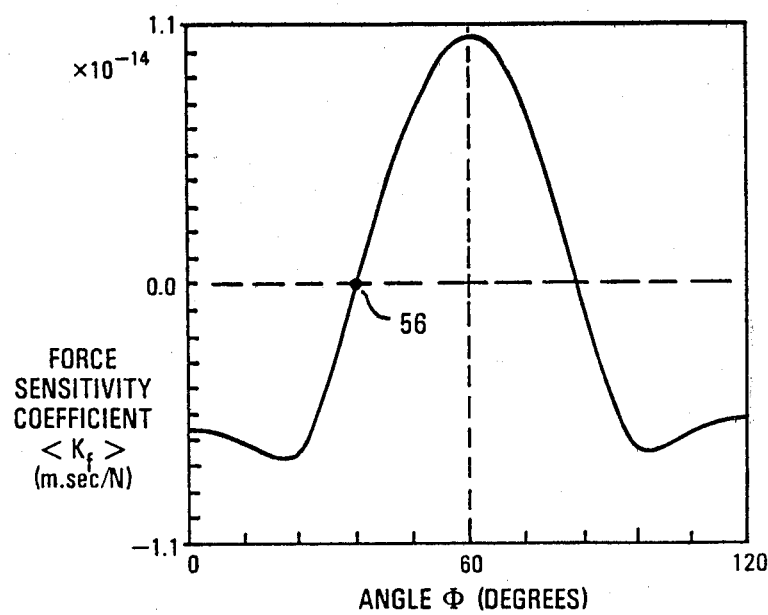
FIG. 9 is a plot of the mean force sensitivity coefficient $<K_f>$ for $\theta$ equal to $-34.5°$ and $\phi$ varied from 0° to 120°, useful in explaining the derivation of the stress compensated orientation loci.
Figure 5:
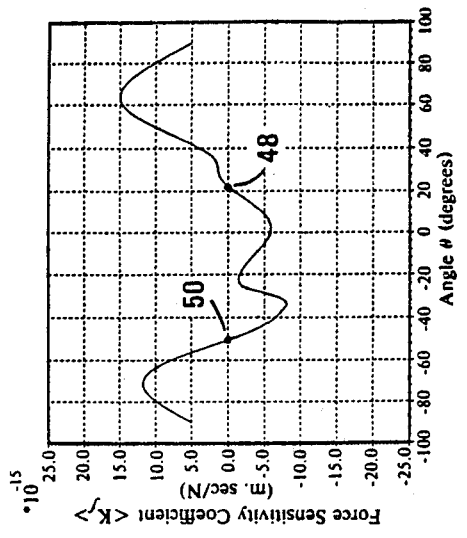
FIGS. 5-8 are plots of the mean force sensitivity coefficient $<K_f>$ for $\phi$ equal to 0.0°, 10.0°, 20.0° and 30.0°, respectively, with $\theta$ varied from $-90.0°$ to $+90.0°$, useful in explaining the derivation of the stress compensated orientation loci.
Figure 6:
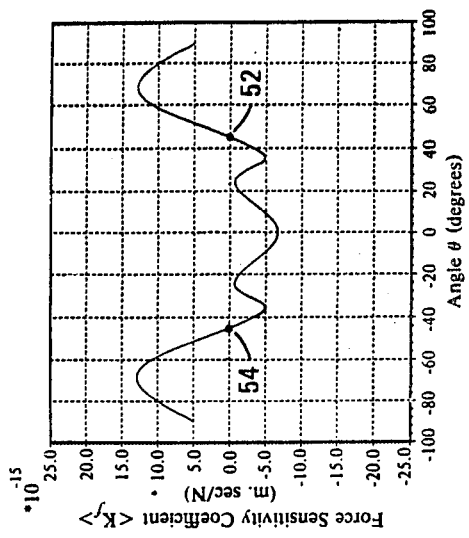
Figure 7:
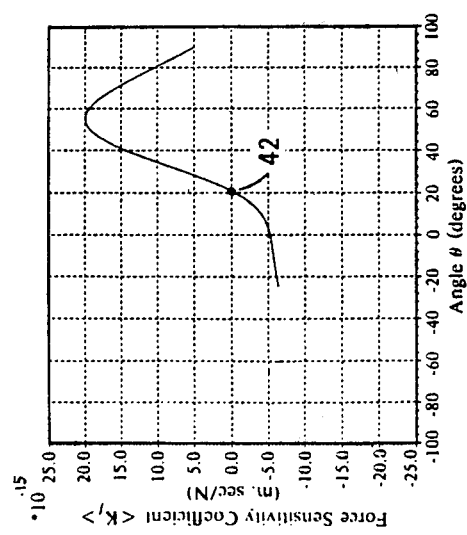
Figure 8:
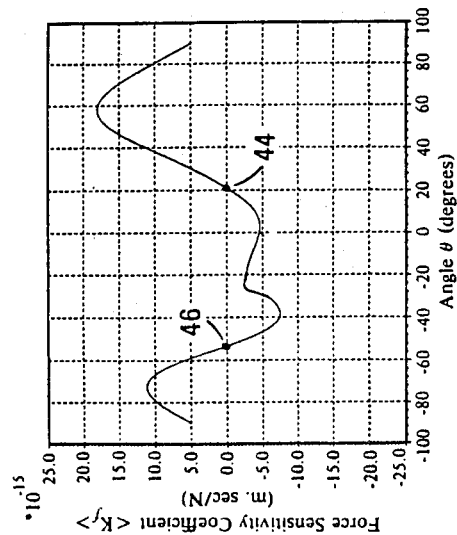

A few representative illustrations of the behavior of the mean stress coefficient $<K_f>$ are presented for C mode in FIGS. 5-9, although both B and C modes were thoroughly investigated. FIG. 5 shows the mean force sensitivity coefficients for $\phi=0.0°$ and $\theta$ varied from $-90°$ to $+90°$. A zero-valued mean force coefficients $<K_f>$ is found at (yxwl) 0.0°/21.0° (point 42). FIG. 6 shows the mean force sensitivity coefficients for $\phi=10.0°$ and $\theta$ varied from $-90°$ to $+90°$. Zero-valued mean force coefficients $<K_f>$ are found at (yxwl) 10.0°/21° (point 44) and at (yxwl) 10.0°/$-53°$ (point 46). FIG. 7 shows the mean force sensitivity coefficients for $\phi=20.0°$ and $\theta$ varied from $-90°$ to $+90°$. Zero-valued mean force coefficients $<K_f>$ are found at (yxwl) 20.0°/22.2° (point 48) and at (yxwl) 20.0°/$-50.4°$ (point 50). FIG. 8 shows the mean force sensitivity coefficients for $\phi=30.0°$ and $\theta$ varied from $-90°$ to $+90°$. Zero-valued mean force coefficients $<K_f>$ are found at (yxwl) 30.0°/44.8° (point 52) and at (yxwl) 30.0°/$-44.8°$ (point 54). FIG. 9 shows the mean force sensitivity coefficients for $\theta=-34.5°$ and $\phi$ varied from 0° to 120° ($\phi$ varied instead of $\theta$; either presentation is acceptable). A zero-valued mean force coefficients $<K_f>$ is found at (yxwl) 38.2°/$-34.5°$ (point 56).

Focussing on FIGS. 5 and 9 as examples, it will be seen that the present invention includes respectively a singly rotated orientation 42 approximately equal to (yxwl) 0°/21.0° and a doubly rotated orientation 56 approximately equal to (yxwl) 38.2°/$-34.5°$ (for C mode). The former cut has been christened the SRSC cut and the latter the SSC cut.

As the result of an exhaustive investigation of the variation of the mean stress coefficient $<K_f>$ for each thickness-shear mode of vibration for $0° < \phi < 120°$ and $-90° < \theta < 90°$, a more than sufficient number of discrete orientations having zero valued $<K_f>$ have been identified to permit the development of loci of stress-compensated orientations for the thickness-shear modes. Some numerical results for B mode are presented in Table 1, while the corresponding plot of the loci of B mode stress compensated orientations is presented in FIG. 10. Some numerical results for C mode are presented in Table 2 ("Intermediate Locus" presented for completeness but excluded from the corresponding plot), while the corresponding plot of the loci of C mode stress compensated orientations is presented in FIG. 11. Information is provided only for the primitive region, it being understood that equivalent orientations are to be found outside of the primitive region in accordance with the various symmetries exhibited by stress compensated quartz cuts, as explained above. Additional numerical results for C mode are presented in Table 3 for the SSC locus, which is outside of the primitive region. Any reference to "approximately (yxwl) 38.2°/$-34.5°$" is intended to comprise the SSC locus.

TABLE 1

Locus 50 (expressed as (yxwl) $\phi/\theta$):
| | | | | |
|---|---|---|---|---|
| 0.0/$-79.1$ | 1.0/$-79.1$ | 2.0/$-79.1$ | 3.0/$-79.1$ | 4.0/$-79.1$ |
| 5.0/$-79.0$ | 6.0/$-79.0$ | 7.0/$-79.0$ | 8.0/$-79.0$ | 9.0/$-79.0$ |
| 10.0/$-78.9$ | 10.5/$-78.9$ | 11.0/$-78.9$ | 11.5/$-78.9$ | 12.0/$-78.9$ |
| 12.5/$-78.9$ | 13.0/$-78.8$ | 13.5/$-78.8$ | 14.0/$-78.8$ | 14.5/$-78.8$ |
| 15.0/$-78.8$ | 15.5/$-78.7$ | 16.0/$-78.7$ | 17.0/$-78.7$ | 18.0/$-78.6$ |
| 19.0/$-78.6$ | 20.0/$-78.5$ | 21.0/$-78.5$ | 22.0/$-78.4$ | 22.5/$-78.4$ |
| 23.0/$-78.3$ | 24.0/$-78.3$ | 25.0/$-78.2$ | 26.0/$-78.2$ | 27.0/$-78.1$ |
| 28.0/$-78.0$ | 29.0/$-78.0$ | 30.0/$-77.9$ | | |

Locus 52 (expressed as (yxwl) $\phi/\theta$):
| | | | | |
|---|---|---|---|---|
| 11.0/$-27.0$ | 11.5/$-27.4$ | 12.0/$-27.7$ | 12.5/$-28.1$ | 13.0/$-28.6$ |
| 13.5/$-29.2$ | 14.0/$-29.8$ | 14.5/$-30.6$ | 15.0/$-31.6$ | 15.5/$-32.8$ |
| 16.0/$-34.0$ | 17.0/$-36.8$ | 18.0/$-39.6$ | 19.0/$-42.1$ | 20.0/$-44.3$ |
| 21.0/$-46.4$ | 22.0/$-48.2$ | 22.5/$-49.0$ | 23.0/$-49.8$ | 24.0/$-51.4$ |
| 25.0/$-52.7$ | 26.0/$-54.0$ | 27.0/$-55.2$ | 28.0/$-56.3$ | 29.0/$-57.3$ |
| 30.0/$-58.2$ | | | | |

Locus 54 (expressed as (yxwl) $\phi/\theta$):
| | | | | |
|---|---|---|---|---|
| 11.0/$-27.0$ | 11.5/$-27.1$ | 12.0/$-27.2$ | 12.5/$-27.3$ | 13.0/$-27.4$ |
| 13.5/$-27.5$ | 14.0/$-27.6$ | 14.5/$-27.8$ | 15.0/$-27.9$ | 15.5/$-27.9$ |
| 16.0/$-28.0$ | 17.0/$-28.2$ | 18.0/$-28.4$ | 19.0/$-28.5$ | 20.0/$-28.6$ |
| 21.0/$-28.8$ | 22.0/$-28.8$ | 22.5/$-28.9$ | 23.0/$-28.9$ | 24.0/$-29.0$ |
| 25.0/$-29.0$ | 26.0/$-29.0$ | 27.0/$-29.0$ | 28.0/$-29.0$ | 29.0/$-29.0$ |
| 30.0/$-28.8$ | | | | |

Locus 56 (expressed as (yxwl) $\phi/\theta$):
| | | | | |
|---|---|---|---|---|
| 0.0/$-23.0$ | 1.0/$-22.8$ | 2.0/$-22.2$ | 3.0/$-22.0$ | 4.0/$-21.5$ |
| 5.0/$-21.0$ | 6.0/$-20.5$ | 7.0/$-20.0$ | 8.0/$-19.5$ | 9.0/$-18.9$ |
| 10.0/$-18.3$ | 10.5/$-18.0$ | 11.0/$-17.7$ | 11.5/$-17.3$ | 12.0/$-17.0$ |
| 12.5/$-16.7$ | 13.0/$-16.3$ | 13.5/$-16.0$ | 14.0/$-15.6$ | 14.5/$-15.2$ |
| 15.0/$-14.8$ | 15.5/$-14.4$ | 16.0/$-14.0$ | 17.0/$-13.1$ | 18.0/$-12.1$ |

TABLE 1-continued

| | | | | |
|---|---|---|---|---|
| 19.0/−10.9 | 20.0/−9.6 | 21.0/−7.9 | 22.0/−5.0 | 22.5/−2.6 |
| 22.5/−1.1 | 22.0/1.4 | 21.0/2.7 | 20.0/3.4 | 19.0/3.9 |
| 18.0/4.2 | 17.0/4.6 | 16.0/4.8 | 15.5/5.0 | 15.0/5.1 |
| 14.5/5.2 | 14.0/5.4 | 13.5/5.5 | 13.0/5.6 | 12.5/5.8 |
| 12.0/5.9 | 11.5/6.0 | 11.0/6.2 | 10.5/6.4 | 10.0/6.5 |
| 9.0/6.9 | 8.0/7.4 | 7.0/7.8 | 6.0/8.5 | 5.0/9.2 |
| 4.0/9.9 | 3.0/10.8 | 2.0/11.6 | 1.0/12.2 | |
| Locus 58 (expressed as (yxwl) $\phi/\theta$): | | | | |
| 0.0/16.7 | 1.0/16.9 | 2.0/17.4 | 3.0/18.0 | 4.0/18.5 |
| 5.0/19.0 | 6.0/19.6 | 7.0/20.2 | 8.0/20.7 | 9.0/21.3 |
| 10.0/21.8 | 10.5/22.1 | 11.0/22.4 | 11.5/22.6 | 12.0/22.9 |
| 12.5/23.1 | 13.0/23.4 | 13.5/23.7 | 14.0/24.0 | 14.5/24.2 |
| 15.0/24.4 | 15.5/24.7 | 16.0/24.9 | 17.0/25.4 | 18.0/25.9 |
| 19.0/26.3 | 20.0/26.6 | 21.0/27.0 | 22.0/27.3 | 22.5/27.4 |
| 23.0/27.6 | 24.0/27.9 | 25.0/28.1 | 26.0/28.3 | 27.0/28.5 |
| 28.0/28.7 | 29.0/28.8 | 30.0/28.8 | | |
| Locus 60 (expressed as (yxwl) $\phi/\theta$): | | | | |
| 0.0/64.8 | 1.0/64.8 | 2.0/64.8 | 3.0/64.8 | 4.0/64.9 |
| 5.0/65.0 | 6.0/65.0 | 7.0/65.1 | 8.0/65.1 | 9.0/65.2 |
| 10.0/65.2 | 10.5/65.2 | 11.0/65.2 | 11.5/65.2 | 12.0/65.2 |
| 12.5/65.2 | 13.0/65.2 | 13.5/65.2 | 14.0/65.1 | 14.5/65.1 |
| 15.0/65.0 | 15.5/65.0 | 16.0/64.9 | 17.0/64.7 | 18.0/64.5 |
| 19.0/64.2 | 20.0/63.9 | 21.0/63.6 | 23.0/62.8 | 24.0/62.3 |
| 25.0/61.7 | 26.0/61.2 | 27.0/60.5 | 28.0/59.8 | 29.0/59.0 |
| 30.0/58.2 | | | | |
| Locus 62 (expressed as (yxwl) $\phi/\theta$): | | | | |
| 0.0/76.5 | 1.0/76.5 | 2.0/76.5 | 3.0/76.5 | 4.0/76.5 |
| 5.0/76.5 | 6.0/76.5 | 7.0/76.5 | 8.0/76.6 | 9.0/76.6 |
| 10.0/76.6 | 10.5/76.6 | 11.0/76.6 | 11.5/76.6 | 12.0/76.6 |
| 12.5/76.7 | 13.0/76.7 | 13.5/76.7 | 14.0/76.7 | 14.5/76.7 |
| 15.0/76.8 | 15.5/76.8 | 16.0/76.8 | 17.0/76.9 | 18.0/76.9 |
| 19.0/77.0 | 20.0/77.1 | 21.0/77.1 | 22.0/77.2 | 22.5/77.2 |
| 23.0/77.3 | 24.0/77.4 | 25.0/77.4 | 26.0/77.5 | 27.0/77.6 |
| 28.0/77.7 | 29.0/77.8 | 30.0/77.9 | | |

TABLE 2

| | | | | |
|---|---|---|---|---|
| Locus 64 (expressed as (yxwl) $\phi/\theta$): | | | | |
| 0.0/20.9 | 5.0/20.8 | 10.0/20.9 | 15.0/21.3 | 20.0/22.2 |
| 20.25/22.3 | 20.5/22.4 | 20.75/22.4 | 21.5/22.7 | 22.0/22.8 |
| 22.5/23.0 | 23.0/23.2 | 23.5/23.5 | 24.0/23.7 | 24.4/24.0 |
| 24.5/24.1 | 25.0/24.6 | 25.4/25.0 | 25.5/25.5 | 25.6/26.0 |
| 25.5/26.4 | 25.4/27.0 | 25.0/27.7 | 24.9/28.0 | |
| Intermediate Locus (expressed as (yxwl) $\phi/\theta$): | | | | |
| [24.5/28.5] | [24.2/29.0] | [24.0/29.4] | [23.6/30.0] | [23.5/30.2] |
| [23.1/31.0] | [23.0/31.3] | [22.7/32.0] | [22.5/33.0] | [22.4/34.0] |
| [22.50/34.8] | [22.52/35.0] | [22.7/36.0] | [23.0/36.7] | [23.1/37.0] |
| [23.5/37.8] | [23.6/38.0] | [24.0/38.6] | [24.2/39.0] | [24.5/39.5] |
| Locus 66 (expressed as (yxwl) $\phi/\theta$): | | | | |
| 24.9/40.0 | 30.0/44.8 | | | |
| Locus 68 (expressed as (yxwl) $\phi/\theta$): | | | | |
| 0.5/−54.0 | 5.0/−53.8 | 10.0/−53.2 | 15.0/−52.1 | 20.0/−50.4 |
| 25.0/−48.0 | 30.0/−44.8 | | | |

TABLE 3

| | | | | |
|---|---|---|---|---|
| SSC Locus (expressed as (yxwl) $\phi/\theta$): | | | | |
| 35.1/−40.0 | 35.5/−39.5 | 35.8/−39.0 | 36.0/−38.6 | 36.4/−38.0 |
| 36.5/−37.8 | 36.9/−37.0 | 37.0/−36.7 | 37.3/−36.0 | 37.48/−35.0 |
| 37.50/−34.8 | 38.2/−34.5 | 37.6/−34.0 | 37.5/−33.0 | 37.3/−32.0 |
| 37.0/−31.3 | 36.9/−31.0 | 36.5/−30.2 | 36.4/−30.0 | 36.0/−29.4 |
| 35.8/−29.0 | 35.5/−28.5 | 35.1/−28.0 | | |

Figure 10:
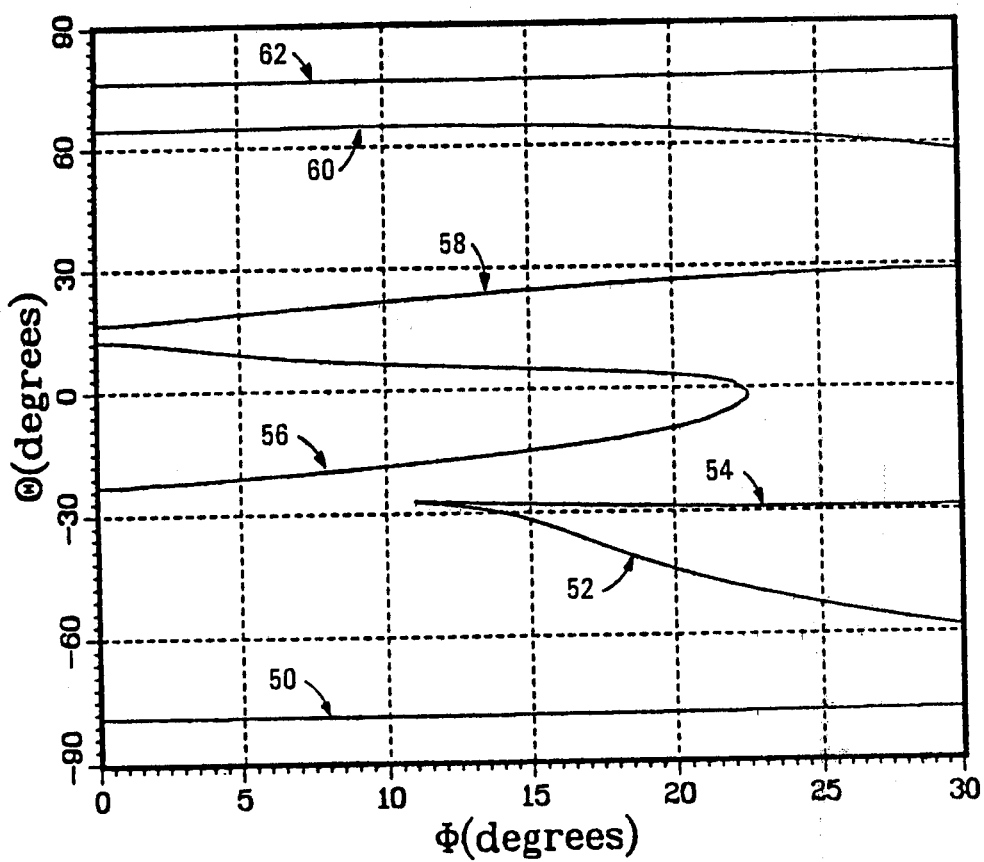
FIGS. 10 and 11 are plots of the stress compensated orientation loci for B and C modes, respectively, over the primitive region, in accordance with the present invention.
Figure 11:
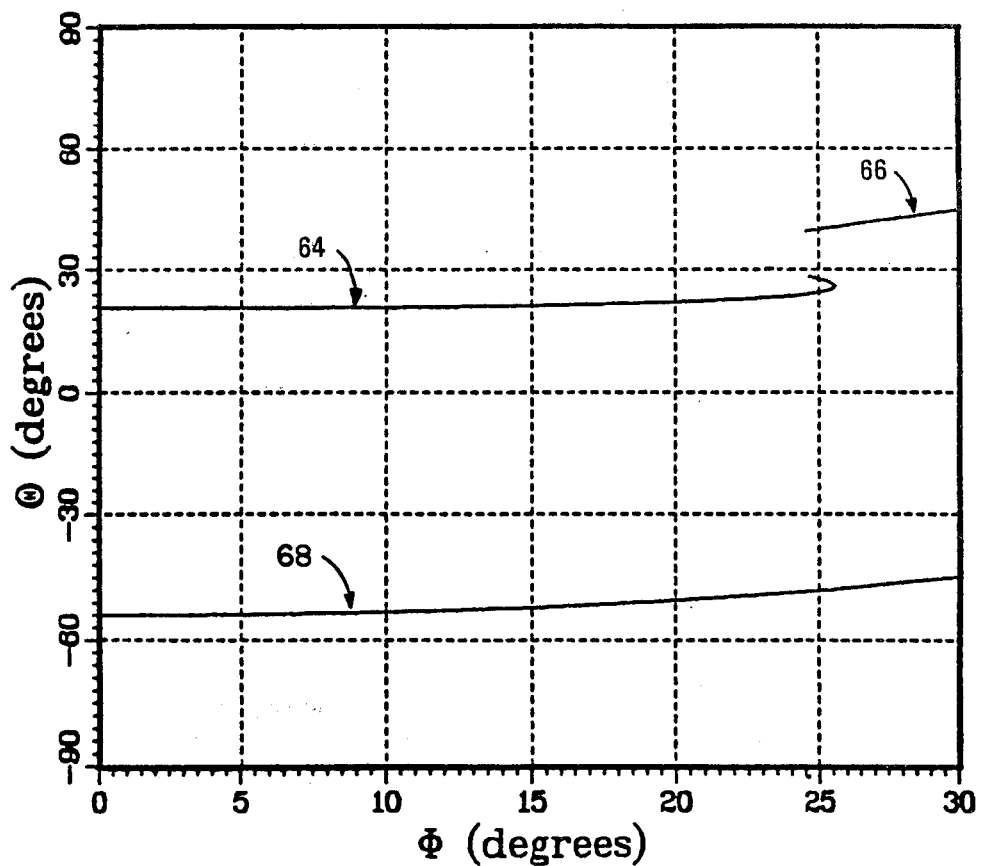

In practice, the orientation of a particular resonator intended to be compensated against radially uniform in-plane stresses induced by such means as electrodes, externally applied load, mechanical mounts, or acceleration may vary by as much as ±4° in $\phi$ and/or $\theta$ from a corresponding orientation indicated in Table 1 or Table 2, or in FIG. 10 or 11. This variation is attributable to such factors as the type and degree of contouring applied to the quartz material, the quality of the quartz material, the shape, dimensions, and material of the electrodes (including, for example, the practice of partial electroding), the type of mounting in which the resonator is set, the operating temperature of the reasonator, operation of the resonator in overtone modes of vibration, and reasonable investigatory and parametric uncertainties.

A thickness-shear quartz reasonator may be employed as a stabilizing element in an oscillator circuit. Basically, an oscillator may be considered to be a closed-loop system comprising an amplifier and a feedback network including the resonator. The amplitude builds to the point where nonlinearities decrease the loop gain to unity, while the frequency adjusts itself so that the total phase shift around the loop is zero (or 360°). The reasonator possesses a large reactance frequency slope, and its impedance changes so sharply with frequency that other circuit components can be considered to be of constant reactance relative to the nominal frequency of the crystal.

A quartz resonator in accordance with this invention will have an orientation for which the stress coefficient D is zero or a minimal value for at least one mode of vibration. An oscillator comprising such a reasonator will be useful in frequency control applications, temperature measurement applications, and/or pressure measurement applications. The suitability of the resonator for a particular application depends on the respective values of its temperature coefficients A, B and C, the value of its stress coefficient D (if nonzero) relative to the value of the temperature coefficients, and the mode or modes of vibration which are exploited.

For frequency control applications, the SSC cut and the other cuts (notably in B mode) having their characteristics are particularly useful. For the SSC cut in C mode, the value of the temperature coefficient A in equation (4) is zero or a minimal value, the temperature coefficients B and C have relatively small values, and the values of the stress coefficient D is zero or minimal. A resonator having one of these orientations is expected to have good long-term stability and fast thermal transient compensation.

Figure 12:
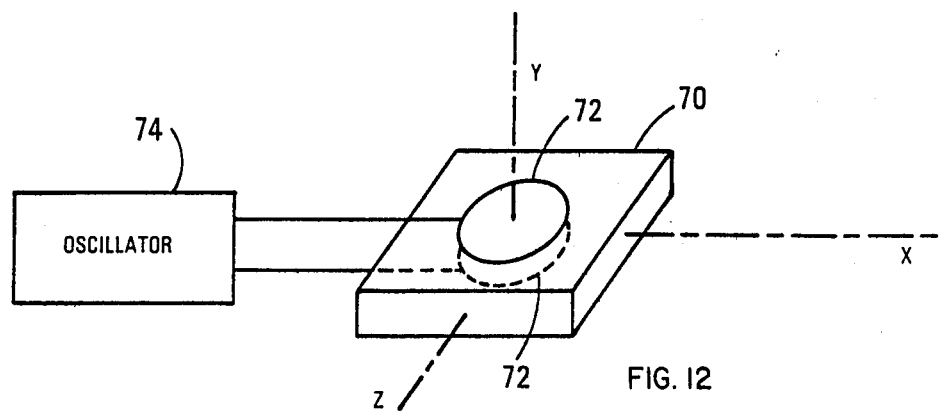
FIG. 12 is a schematic diagram of an apparatus suitable for frequency control or temperature measurement without requiring elaborate stress compensating means, in accordance with the present invention.

Suitable frequency-stable oscillator circuits are well known in the art. The reasonator itself may have the configuration shown in FIG. 12, in which the reasonator is a disk-like vibratory region approximately between circular electrodes 72 deposited on respective surfaces of a quartz plate 70. Axes X and Z define the major plane. Generally, forces acting on plate 70 (for example, through a plate retaining structure, not shown) are resolved into radially uniform planar stress within the vibratory region. Since the plate has a stress compensated orientation, the reasonator is relatively insensitive to the stress. Oscillation is maintained by oscillator 74. Other configurations are known. This configuration basically is suitable for temperature measurement applications as well.

More generally, the orientations defined by the coincidence of the B mode temperature compensated orientation loci (FIG. 1) and B mode stress compensated orientation loci (FIG. 10) and the coincidence of the C mode temperature compensated orientation loci (FIG. 2) and C mode stress compensated orientation loci (FIG. 11) will be particularly useful in frequency control applications. For B mode, the orientations are (yxwl) $\phi/\theta$: 1°/−23.0°, 13.0°/−27.5° and 14.2°/−30.0°. For C mode, the orientation is (yxwl) 38.2°/−24.5°, the SSC cut (the SC cut is known). It should be noted, however, that the material Q for the B mode is usually higher than that for the C mode, which other factors being equal, means that the frequency stability of B mode resonators would be greater than the frequency stability of C mode resonators.

For temperature measurement applications, the SRSC cut and cuts having similar characteristics are particularly useful. For the SRSC cut in C mode, the value of the temperature coefficient A in equation (2) is relatively large, the temperature coefficients B and C have relatively small values, and the value of the stress coefficient D is zero or minimal. Consequently, a temperature sensor employing the SRSC cut is expected to measure relatively small differences in temperature with superior accuracy and sensitivity. A resonator having the SRSC orientation is expected to have good long-term stability, like a resonator having the known SC orientation. Compared to the LC cut used in the Hewlett-Packard quartz thermometer (described above) the SRSC cut is characterized by $A \cong 45$ ppm/°C. and D zero or minimal. As used in such a temperature sensor, a resonator employing the SRSC cut is capable of being brought in more immediate thermal contact with the environment being measured than the resonator of the Hewlett-Packard thermometer, since no high compliance enclosure need be used because of the stress compensated characteristic. Of course, a suitable mounting (see FIG. 12 and associated text) would be provided, such mountings being known in the art.

More generally, the orientations defined by the B mode stress compensated orientation loci (FIG. 10) and the C mode stress compensated orientation loci (FIG. 11), and having large-valued temperature coefficients A, B and/or C will be useful in temperature measurement control applications. Values for the temperature coefficients A, B and C are known in the art. The SRSC cut is particularly useful, however, because it is a singly rotated cut (and therefore more easily fabricated than a doubly rotated cut) and has a large-valued A and relatively small-valued B and C.

The orientations defined by the coincidence of the B mode stress compensated orientation loci (FIG. 10) and the C mode stress compensated orientation loci (FIG. 11) will be particularly useful in precision temperature measurement control applications. Respective independent temperature measurements are available from B and C modes of vibration of the same resonator, thereby providing redundant indications for the parameter being measured and also permitting detection of erroneous device operation if independent oscillator circuitry is used. The orientations are (yxwl) $\phi/\theta$: 7.0°/20.0°, 24.7°/27.8° and 22.8°/−49.5°.

Figure 2:
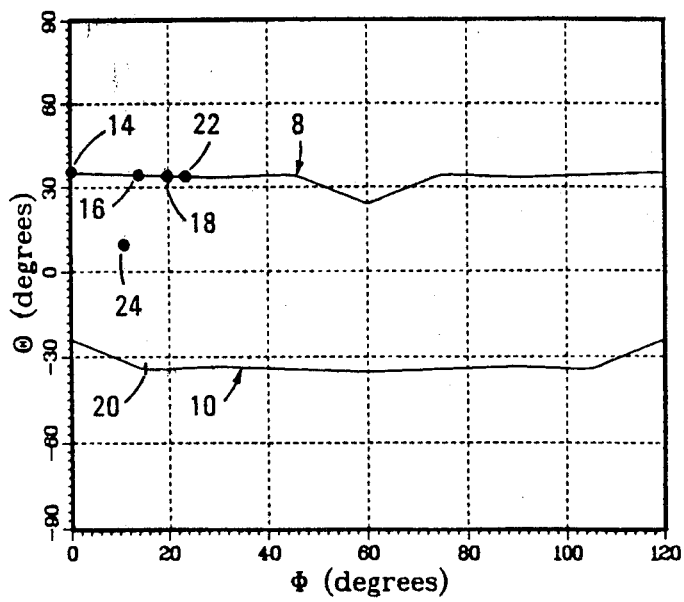

For precision pressure measurement applications, an orientation of particular suitability is (yxwl) 16.3°/−34.5°, defined by the coincidence of the B mode stress compensated orientation loci (FIG. 10) with the C mode temperature compensated orientation loci (FIG. 2). A quartz cut having this orientation is hereinafter referred to as the SBTC (Stress Compensated in B mode and Temperature Compensated in C mode) cut. A resonator of this orientation may be excited to vibrate in both B and C modes. Pressure measurements may be obtained from C mode. Over a broad range of temperatures and pressures, however, C mode frequencies would include small errors due to temperature effects while C mode frequencies would include small errors due to stress effects. The C mode frequencies may be corrected for the extremely small but troublesome temperature effects using temperature measurements obtained from B mode, as explained below.

The frequency-temperature and frequency-stress behavior of a resonator excited in the two thickness-shear modes of vibration (B and C modes) can be characterized (ignoring higher order terms) by the equation:

$$\begin{bmatrix} \frac{\Delta f_B}{f_B} \\ \frac{\Delta f_C}{f_C} \end{bmatrix} = \begin{bmatrix} M_B & D_B \\ M_C & D_C \end{bmatrix} \begin{bmatrix} \Delta T \\ \Delta P \end{bmatrix} \quad (7)$$

where $M = A + B\Delta T + C\Delta T^2$, the subscripts B and C indicate the pertinent mode of vibration and the other terms are defined above. The quantities $\Delta T$ and $\Delta P$ are determined by inverting the coefficient matrix in Equation (7). For greatest resolution the diagonal elements should be dominant, which requires, for example, that $M_B >> D_B$ and $D_C >> M_C$.

The empirical analogy, simply stated, is that the relatively large temperature effects in one mode of vibration are used to precisely compensate for the relatively small temperature effects in the other mode of vibration.

In more detail, a number of various methods may be applied for achieving temperature compensation in pressure measurements, including curve fitting routines and look-up and interpolation routines. In a curve fitting implementation, for example, the first step is a calibration process in which both the B and C mode frequencies are measured at selected temperatures and pressures over the required operating range. The actual frequencies of the B and C modes can be expressed as respective polynomials in temperature and pressure:

$$f_B = f_{BR}(1 + A_B\Delta T + B_B\Delta T^2 + C_B\Delta T^3 + D_B\Delta P) \quad (8)$$

$$f_C = f_{CR}(1 + A_C\Delta T + B_C\Delta T^2 + C_C\Delta T^3 + D_C\Delta P) \quad (9)$$

where $f_B$ is the actual B mode frequency, $f_{BR}$ is the B mode reference frequency, $f_C$ and $f_{CR}$ are similarly defined for C mode, and the other terms are as defined above. The actual B mode frequency $f_B$ can be measured using the C mode frequency $f_C$ as the reference. It is then known from frequency counter principles that the relative error in the measured B mode frequencies is identical to that of the C mode frequency signal. Therefore, after selection of a reference frequency $f_{CR}$, the frequencies $f_B$ can be determined as a function of temperature and fixed pressure from the relation:

$$f_B(T,P) = f_{BM}(T,P)\{1 + (f_{CM}(T,P) - f_{CR})/f_{CR}\} \quad (10)$$

where $f_{BM}$ and $f_{CM}$ are the measured frequencies for B and C modes, respectively.

Several values of $f_B(T,P)$ are thus obtained for various temperature and pressure data, whereby, the temperature of the probe can be expressed as polynomial of the form:

$$T = A + Bf_B + Cf_B^2 + Df_B^2 + \quad (11)$$

at a fixed pressure. This curve fitting routine can be implemented on any suitable processor or general purpose computer, whereby the temperature induced error in the C-mode frequency can be compensated to provide the shift in the reference frequency $f_{CR}$ as a function of applied pressure and independent of temperature fluctuations.

Figure 1:
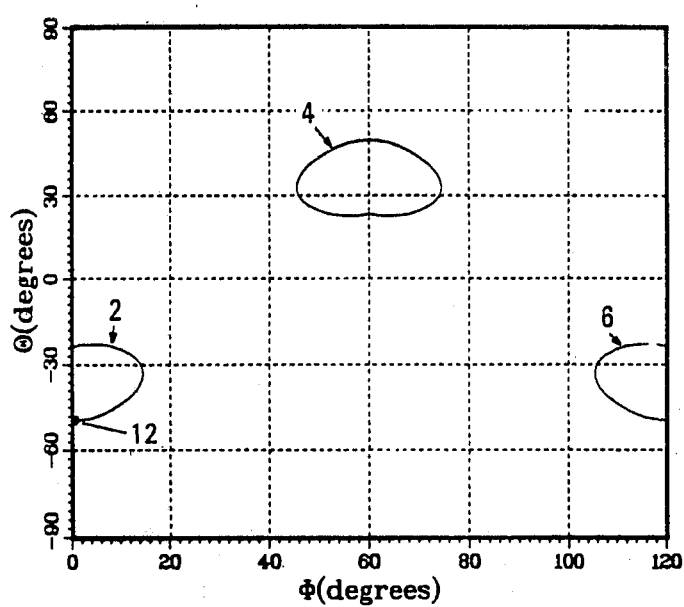
FIGS. 1 and 2 are plots of temperature compensated orientation loci for the thickness shear modes of vibration, modes B and C respectively.

The SBTC cut may advantageously be used in a pressure sensor structure such as that disclosed, for example, in FIG. 1 and pertinent textual portions of U.S. Pat. No. 3,561,832 (issued Feb. 9, 1971 to Karrer et al.), hereby incorporated herein by reference thereto, and combined with suitable circuitry for extremely precise pressure measurement.

Figure 13:
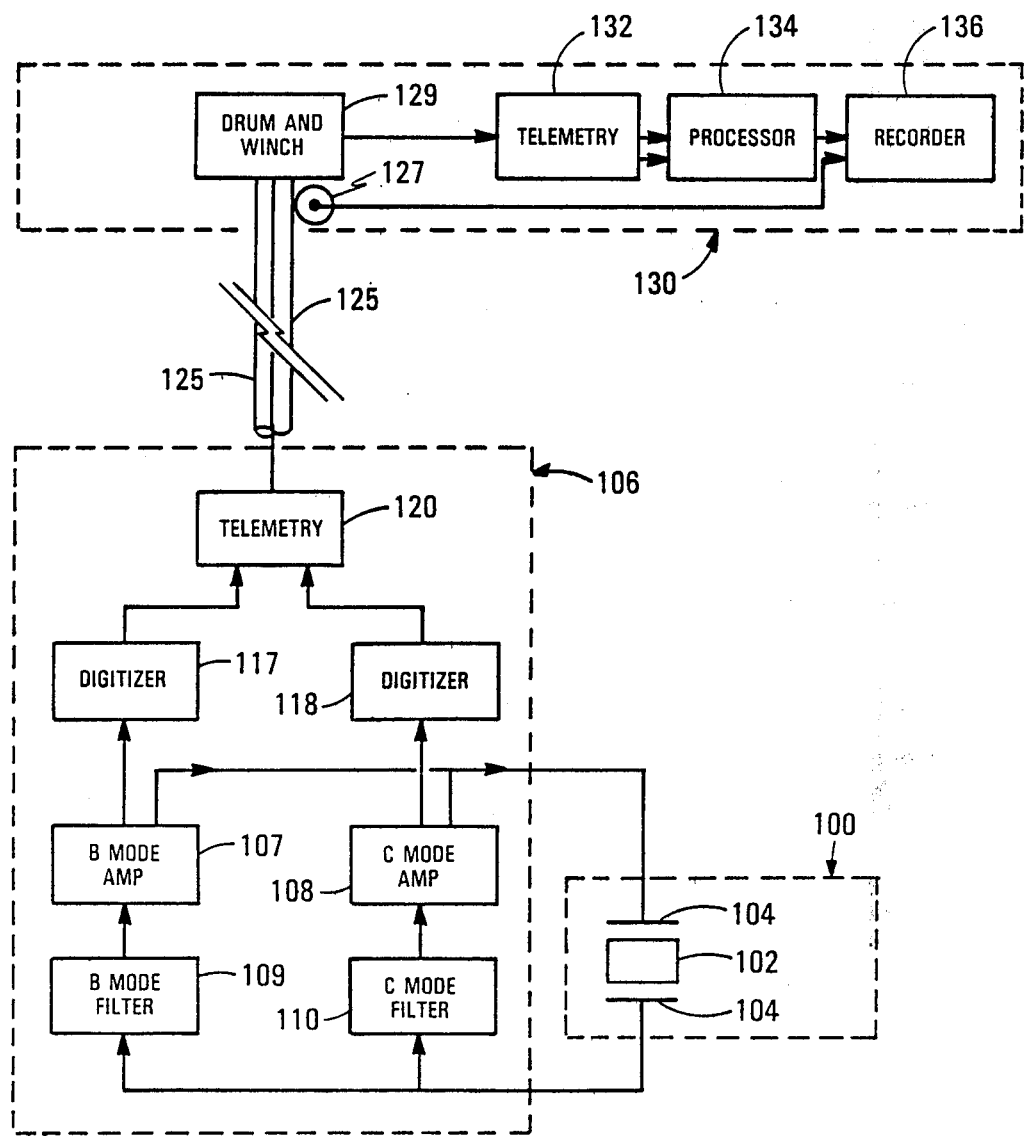
FIG. 13 is a schematic diagram of an apparatus suitable for measuring pressures in a well borehole passing through earth formations with extremely fine precision, in accordance with the present invention.

A high-precision pressure sensor system particularly suitable for use in oil well logging of earth formations through which a borehole passes is shown in FIG. 13. A suitable quartz pressure sensor generally indicated at 100 comprises a quartz resonator 102 having the SBTC orientation (yxwl) 16.3°/−34.5° (±4° in $\phi$ and/or $\theta$) or an orientation sufficiently close thereto to exhibit the characteristics described in reference to Equation (7) disposed between electrodes 104. The pressure sensor 100 and associated downhole electronics 106 typically are mounted in a logging device such as, for example, the tool to take multiple formation fluid pressures disclosed in U.S. Pat. No. 3,577,781, issued May 4, 1971 to Lebourg et al. hereby incorporated herein by reference thereto. The reasonator 102 is made to vibrate simultaneously in both the B and C modes of vibration by application of an AC signal to electrodes 104 by amplifiers 107 and 108 corresponding to the B and C mode frequencies, respectively. Filter networks 109 and 110, each having appropriate poles and/or zeros relative to the B and C mode frequencies respectively, are provided to separate the energy from the variation in the two modes of the single pair of electrodes 104.

The B and C mode signals from amplifiers 107 and 108 are applied to respective digitizers 117 and 118. The digitized signals are applied to telemetry system 120 where they are multiplexed and transmitted to the surface equipment, generally indicated at 130, over an armored cable 125.

The logging device is suspended in the borehole on the armored cable 125, the length of which substantially determines the relative depth of the logging device. The length of armored cable 125 is controlled by suitable means at the surface, such as a drum and winch mechanism 129. The armored cable 125 is rewound on the drum to raise the logging device toward the surface as measurements are taken. Depth measurements are provided by a measure wheel 127 or other suitable means. Telemetry signals transmitted over armored cable 125 are supplied to telemetry system 132 through the drum and winch mechanism 129. The signals are demultiplexed and the digital frequency information for the B and C modes is supplied to processor 134. Processor 134 determines the temperature compensated pressure in accordance with the curve fitting routine described above or any other suitable method, and supplies this information to recorder 136 which, receiving depth information from measure wheel 127, records pressure as a function of depth.

While the invention has been described with reference to particular embodiments as presently conceived, it is to be appreciated that the embodiments are illustrative and that the invention is not intended to be limited to the disclosed embodiments. Variations within the spirit and scope of the invention will occur to those skilled in the art.

What is claimed is:

1. A stress compensated thickness-shear resonator adapted to vibrate in at least one of its fast and slow thickness-shear modes of vibration at a frequency substantially determined by the thickness thereof, said resonator being of an orientation selected from the group consisting of the orientations (yxwl) $\phi/\theta$ defined by the loci of FIG. 10 and the orientations (yxwl) $\phi/\theta$ defined by the loci of FIG. 11, plus or minus 4° in $\phi$ and $\theta$.

2. A resonator as in claim 1, further having a substantially circular major plane.

3. A stress-compensated thickness-shear resonator adapted to vibrate in a fast thickness-shear mode at a frequency substantially determined by the thickness thereof, said resonator having a substantially circular major plane with a thickness axis normal thereto and having an orientation selected from the group consisting of the orientations (yxwl) $\phi/\theta$ defined by the loci of FIG. 10 plus or minus 4° in $\phi$ and $\theta$ to obtain a zero or substantially zero stress coefficient of frequency for said fast thickness-shear mode.

4. A stress-compensated thickness-shear resonator adapted to vibrate in a slow thickness-shear mode at a frequency substantially determined by the thickness thereof, said resonator having a substantially circular major plane with a thickness axis normal thereto and having an orientation selected from the group consisting of the orientations (yxwl) $\phi/\theta$ defined by the loci of FIG. 11 plus or minus 4° in $\phi$ and $\theta$ to obtain a zero or substantially zero stress coefficient of frequency for said slow thickness-shear mode.

5. A resonator as in claim 2, 3 or 4, further having a biconvex contour.

6. A stress-compensated thickness-shear resonator adapted to vibrate in a slow thickness-shear mode at a frequency substantially determined by the thickness thereof, said resonator having a substantially circular major plane with a thickness axis normal thereto and having an orientation approximately (yxwl) 38.2°/−34.5°.

7. A stress-compensated thickness-shear resonator adapted to vibrate in a slow thickness-shear mode at a frequency substantially determined by the thickness thereof, said resonator having a substantially circular major plane with a thickness axis normal thereto and having an orientation (yxwl) 38.2°/−34.5°, plus or minus 2° in $\phi$ and $\theta$.

8. A stress-compensated thickness-shear resonator adapted to vibrate in a slow thickness-shear mode at a frequency substantially determined by the thickness thereof, said resonator having a substantially circular major plane with a thickness axis normal thereto and having an orientation (yxwl) 0°/22.5° plus or minus 4° in $\phi$ and $\theta$.

9. A stress-compensated thickness-shear resonator adapted to vibrate in a slow thickness-shear mode at a frequency substantially determined by the thickness thereof, said resonator having a substantially circular major plane with a thickness axis normal thereto and having an orientation (yxwl) 0°/22.5° plus or minus 2° in $\phi$ and $\theta$.

10. An oscillator having stable frequency-stress behavior comprising:
   a stress compensated thickness-shear resonator adapted to vibrate in at least one of its fast and slow thickness-shear modes of vibration at a frequency substantially determined by the thickness thereof, said resonator being of an orientation selected from the group consisting of the orientations (yxwl) $\phi/\theta$ defined by the loci of FIG. 10 and the orientations (yxwl) $\phi/\theta$ defined by the loci of FIG. 11, plus or minus 4° in $\phi$ and $\theta$;

means for mounting said resonator and for transforming stresses arising from external pressure to uniform stresses in the major plane of said reasonator; and means for generating and supplying an electric field to said resonator for exciting said at least one thickness-shear mode.

11. An oscillator having stable frequency-stress behavior comprising:

a stress compensated thickness-shear resonator adapted to vibrate in a slow thickness-shear mode of vibration at a frequency substantially determined by the thickness thereof, said resonator being of an orientation approximately (yxwl) 38.2°/−34.5°;

means for mounting said resonator and for transforming stresses arising from external pressure to uniform stresses in the major plane of said resonator; and means for generating and supplying an electric field to said resonator for exciting said slow thickness-shear mode.

12. An oscillator having stable frequency-stress behavior comprising:

a stress compensated thickness-shear resonator adapted to vibrate in a fast thickness-shear mode of vibration at a frequency substantially determined by the thickness thereof, said resonator being of an orientation (yxwl) 1.0°/−23.0° plus or minus 4° in $\phi$ and $\theta$;

means for mounting said resonator and for transforming stresses arising from external pressure to uniform stresses in the major plane of said resonator; and means for generating and supplying an electric field to said resonator for exciting said fast thickness-shear mode.

13. An oscillator having stable frequency-stress behavior comprising:

a stress compensated thickness-shear resonator adapted to vibrate in a fast thickness-shear mode of vibration at a frequency substantially determined by the thickness thereof, said resonator being of an orientation (yxwl) 13.°/−27.5° plus or minus 4° in $\phi$ and $\theta$;

means for mounting said resonator and for transforming stresses arising from external pressure to uniform stresses in the major plane of said resonator; and means for generating and supplying an electric field to said resonator for exciting said fast thickness-shear mode.

14. An oscillator for temperature measurements having stable frequency-stress behavior comprising:

a stress compensated thickness-shear resonator adapted to vibrate in at least one of its fast and slow thickness-shear modes of vibration at a frequency substantially determined by the thickness thereof, said resonator being of an orientation selected from the group consisting of the orientations (yxwl) $\phi/\theta$ defined by the loci of FIG. 10 and the orientations (yxwl) $\phi/\theta$ defined by the loci of FIG. 11, plus or minus 4° in $\phi$ and $\theta$, and having large-valued temperature coefficients of frequency A, B and/or C;

means for effecting thermal contact between said resonator and an external temperature;

means for mounting said resonator and for transforming stresses arising from external pressure to uniform stresses in the major plane of said resonator; and means for generating and supplying an electric field to said resonator for exciting said at least one thickness-shear mode.

15. An oscillator for temperature measurements having stable frequency-stress behavior comprising:

a stress compensated thickness-shear resonator adapted to vibrate in a slow thickness-shear mode of vibration at a frequency substantially determined by the thickness thereof, said resonator being of an orientation (yxwl) 0°/21° plus or minus 4° in $\phi$ and $\theta$;

means for effecting thermal contact between said resonator and an external temperature;

means for mounting said resonator and for transforming stresses arising from external pressure to uniform stresses in the major plane of said resonator; and means for generating and supplying an electric field to said resonator for exciting said slow thickness-shear mode.

16. An oscillator for temperature measurements having stable frequency-stress behavior comprising:

a stress compensated thickness-shear resonator adapted to vibrate in its slow and fast thickness-shear modes of vibration at respective frequencies substantially determined by the thickness thereof, said resonator being of an orientation (yxwl) 7.0°/22.0° plus or minus 4° in $\phi$ and $\theta$;

means for effecting thermal contact between said resonator and an external temperature;

means for mounting said resonator and for transforming stresses arising from external pressure to uniform stresses in the major plane of said resonator; and means for generating and supplying an electric field to said resonator for exciting said slow and fast thickness-shear modes.

17. An oscillator for temperature measurements having stable frequency-stress behavior comprising:

a stress compensated thickness-shear resonator adapted to vibrate in its slow and fast thickness-shear modes of vibration at respective frequencies substantially determined by the thickness thereof, said resonator being of an orientation (yxwl) 24.7°/27.8° plus or minus 4° in $\phi$ and $\theta$;

means for effecting thermal contact between said resonator and an external temperature;

means for mounting said resonator and for transforming stresses arising from external pressure to uniform stresses in the major plane of said resonator; and means for generating and supplying an electric field to said resonator for exciting said slow and fast thickness-shear modes.

18. An oscillator for temperature measurements having stable frequency-stress behavior comprising:

a stress compensated thickness-shear resonator adapted to vibrate in its slow and fast thickness-shear modes of vibration at respective frequencies substantially determined by the thickness thereof, said resonator being of an orientation (yxwl) 22.8°/−49.5° plus or minus 4° in $\phi$ and $\theta$;

means for effecting thermal contact between said resonator and an external temperature;

means for mounting said resonator and for transforming stresses arising from external pressure to uniform stresses in the major plane of said resonator; and means for generating and supplying an electric field to said resonator for exciting said slow and fast thickness-shear modes.

19. An oscillator as in claim 10, 11, 12, 13, 14, 15, 16, 17 or 18, wherein said resonator further has opposite surfaces of selected contour spaced about a substantially circular major plane.

20. An oscillator as in claim 19, wherein said selected contour is biconvex.

21. A pressure sensor comprising:
- a stress-compensated thickness-shear resonator adapted to vibrate in fast thickness-shear and slow thickness-shear modes of vibration at respective frequencies substantially determined by the thickness thereof, said resonator being approximately of the orientation (yxwl) 16.3+/−34.5° and having opposite surfaces of selected contour spaced about a substantially circular major plane, and further being stress compensated for said fast thickness-shear mode and temperature compensated for said slow thickness mode;
- means for mounting said resonator and for transforming stresses arising from external pressure to uniform stresses in the major plane of said resonator; and
- means for generating and supplying an electric field to said resonator for exciting said fast and slow thickness-shear modes.

22. A pressure sensor as in claim 21 further comprising:
- means for isolating respective frequency signals of said fast thickness-shear and said slow thickness-shear modes;
- means responsive to said slow thickness-shear mode frequency signal for providing an indication of the pressure of the environment being investigated; and
- means responsive to said fast thickness-shear mode frequency signal for compensating said pressure indication with the frequency signal of said fast thickness-shear mode, whereby said pressure indication is relatively independent of temperature induced effects.

23. A resonator as in claim 21 or 22, wherein the orientation of said resonator is within ±4° in $\phi$ and $\theta$ of (yxwl) 16.3°/−34.5°.

* * * * *